United States Patent [19]

Douglass

[11] Patent Number: 5,691,934
[45] Date of Patent: Nov. 25, 1997

[54] MEMORY CELL AND METHOD OF OPERATION THEREOF

[76] Inventor: Barry G. Douglass, 1930 W. Rundberg La., No. 1236, Austin, Tex. 78758

[21] Appl. No.: 502,243

[22] Filed: Jul. 13, 1995

[51] Int. Cl.$^6$ ............................................. G11C 7/00
[52] U.S. Cl. .................. 365/149; 365/105; 365/175; 365/184; 365/203
[58] Field of Search ..................... 365/149, 175, 365/184, 203, 105

[56] References Cited

U.S. PATENT DOCUMENTS

| | | | |
|---|---|---|---|
| 2,823,368 | 2/1958 | Avery . | |
| 4,023,148 | 5/1977 | Heuber et al. . | |
| 4,920,513 | 4/1990 | Takeshita et al. . | |
| 5,063,539 | 11/1991 | Rallapalli | 365/175 X |
| 5,267,192 | 11/1993 | Nogami . | |
| 5,357,465 | 10/1994 | Challa | 365/185 |
| 5,361,225 | 11/1994 | Ozawa | 365/175 X |
| 5,408,431 | 4/1995 | Challa | 365/185 |
| 5,414,658 | 5/1995 | Challa | 365/185 |
| 5,471,087 | 11/1995 | Buerger, Jr. | 365/175 X |
| 5,483,482 | 1/1996 | Yamada et al. | 365/175 |
| 5,508,955 | 4/1996 | Zimmer et al. | 365/185.16 |
| 5,535,156 | 7/1996 | Levy et al. | 365/175 |

FOREIGN PATENT DOCUMENTS 60-136099   11/1985   Japan .

OTHER PUBLICATIONS

Paper entitled "Principles of CMOS VLSI Design–A Systems Perspective", by Neil H. E. Weste and Kamran Eshraghian, published by Addison–Wesley Publishing Co., pp. 362–364, ©1985 by AT&T Bell Laboratories, Inc. and K. Eshraghian.

*Primary Examiner*—Do Hyun Yoo
*Attorney, Agent, or Firm*—David H. Carroll

[57] ABSTRACT

An extremely compact dynamic memory cell (200) includes a capacitor (204) or any other suitable stored charge device, and a diode (208) such as a Zener diode, a pair of parallel, reverse-connected diodes, or any other suitable voltage dropping device having substantially definite voltage drops when conducting in each direction. The capacitor and Zener diode are connected in series between a Row Select line (202) and a Column Bit line (210). These structures are suitable for fabrication by any of a variety of processes used to fabricate conventional semiconductor DRAMs. The memory cell is replicated millions of times and arrayed in rows and columns as in conventional one-transistor MOSFET DRAM memories to form a memory integrated circuit. Rows of cells are accessed by asserting the corresponding Row Select line, and columns are accessed by asserting the Column Bit line. Circuits suitable for controlling these Row Select and Column Bit line operations are similar to those used in traditional one-transistor cell DRAMs, but are modified to apply suitable voltage sequences during inactive periods and during memory read/rewrite and write operations. Suitable voltages and voltage sequence for operating the dynamic memory cell in its various modes include an ideal voltage relationship as well as an exemplary set of voltages and sequences.

20 Claims, 10 Drawing Sheets

MEMORY CELL AND METHOD OF OPERATION THEREOF

BACKGROUND OF THE INVENTION

1. Field of the Invention

The invention relates generally to semiconductor memories, and more particularly to dynamic random access memory cells, arrays of dynamic random access memory cells, and operation of arrays of dynamic random access memory cells.

2. Description of the Related Art

Dynamic random access memories, or DRAMs, are widely used in the electronics industry. A typical DRAM architecture is shown in FIG. 1. A memory cell array 30 includes an array of dynamic memory cells. Each dynamic memory cell stores digital information as charge on a capacitor, which typically is in series with a selection transistor. A binary address is applied to the address decoder 10, the output lines of which control a word selector circuit 20. The output lines of the word selector circuit 20 are word lines of the memory cell array 30. Bit drivers 50 are used in conjunction with the word selector circuit 20 to write data to the cells of the array 30, and bit detectors 40 are used in conjunction with the word selector circuit 20 to read data from the cells of the array 30.

A typical one-transistor dynamic random access memory cell array is shown in FIG. 2. The select transistors 112, 114, 116, 122, 124 and 126 typically are MOS type, and the capacitors 113, 115, 117, 123, 125 and 127 typically are inversion layer type. The gates of the select transistors 112, 114, 116, 122, 124 and 126 are respectively connected to the row lines ROW 0, ROW 1, . . . , ROW 63, ROW 64, ROW 65, . . . , and ROW 127, and their drains are connected to the bit line.

During a read operation, the select transistor connected to the addressed row line is turned on and the charge in the series-connected capacitor is redistributed between the capacitor and the bit line capacitance. The bit line swing is detected by the sense/refresh circuit 130, which typically is a gated flip-flop. Because the read operation is destructive, the sense/refresh circuit 130 also functions as a cell refresh amplifier. The memory array of FIG. 2 is split into two sections 110 and 120 with respective bit line halves A and B, to reduce the bit line capacitance as seen from the addressed memory cell and to take advantage of the symmetry of the balanced detector in the sense/refresh circuit 130.

The READ/REWRITE cycle begins with the column select, $V_{FF}$, and the sense line set low. The bit line halves A and B are precharged to $V_{REF}$ through transistors 111 and 121. One of the memory cells, e.g. the cell composed of select transistor 112 and capacitor 113, is gated by a Row Select signal, e.g. select signal ROW0, causing a slight voltage perturbation on the bit line half A. The cross-coupled feedback lines of the flip-flop in the sense/refresh circuit 130, which is composed of transistors 132 and 134, are connected to the bit line halves A and B through transistors 131 and 133 by raising $V_{FF}$, and the flip-flop is enabled by raising the sense line. Upon assertion of the sense line, the flip-flop goes from a quasi-stable state to a final state determined by the slight difference in voltage of the bit line halves A and B. Next, the column select signal is asserted to read the final state of the flip-flop in the sense/refresh circuit 130, which appears on lines SENSE_OUT and SENSE_OUT_B.

Because of the regenerative action of the flip-flop in the sense/refresh circuit 130, the data line half to which the selected memory cell is connected is driven all the way to a high or low voltage, depending on the state of the selected memory cell. The driven half of the data line recharges the selected memory cell.

Because of the small size and low power consumption of the dynamic memory cell, DRAM memory is typically more dense than other types of random access memories. As the industry strives for even greater memory capacity, a dynamic memory cell that would make possible the fabrication of higher capacity memories with the same fabrication processes as used for conventional DRAM memories would be particularly advantageous.

SUMMARY OF THE INVENTION

The memory cell of the present invention is a particularly compact cell that permits the fabrication of DRAM memories that are more dense than conventional DRAM memories fabricated with the same process. The memory cell of the present invention uses diodes instead of transistors. Diodes are both more primitive electronically than transistors, and are smaller than transistors in terms of the chip area they occupy. Because of their more primitive nature, diodes permit manufacturing tolerances to be eased even while achieving more dense memories, or significantly more dense memories to be achieved using the same manufacturing tolerances. Also because of their simplicity, diodes require fewer manufacturing steps than transistors, which reduces fabrication cost and increases yield. In addition, the operating characteristics of semiconductor diodes involve an exponential relationship between the voltage and current, as compared to a quadratic relationship for similar MOSFET transistor-based memories. Thus leakage currents and losses during cell access can be improved over equivalent transistor-based memories, resulting in higher-performance circuits.

In one embodiment, the present invention is a memory cell comprising a first cell node (e.g., a cell select node), a second cell node (e.g., a bit node), a stored charge device (e.g., a capacitor), and a voltage dropping device having substantially definite voltage drops while conducting in each direction (e.g., a Zener diode). The stored charge device and the voltage dropping device are coupled in series between the first cell node and the second cell node.

In another embodiment, the present invention is a method to access a memory comprising a plurality of select lines and bit lines and a plurality of memory cells. Each of the memory cells is coupled between one of the select lines and one of the bit lines. Each of the memory cells is also characterized by a charge state that includes at different times a first voltage $V_1$ representing a first logical state and a second voltage $V_2$ representing a second logical state, the first voltage $V_1$ being greater than the second voltage $V_2$; and by voltage thresholds $V_{sb}$ and $V_{bs}$ when conducting current in different directions, $V_{sb}$ being in the direction of the select line to the bit line, and $V_{bs}$ being in the direction of the bit line to the select line. A voltage $V_s$ is established on a selected one of the select lines and a voltage $V_b$ is established on a selected one of the bit lines to access the memory cell coupled therebetween, a voltage differential being imposed across the accessed memory cell in the select-to-bit direction when $V_s > V_b$, and in the bit-to-select direction when $V_b > V_s$. The voltage differential is established at a magnitude to cause charge sharing between the accessed memory cell and the selected column line for at least one of the first and second logical states, the voltage differential being defined by $V_s + V_1 > V_b + V_{sb}$ to perturb the voltage $V_b$ by increasing charge on the selected bit lines, and being defined by $V_b > +V_s + V_{bs} + V_2$ to perturb the voltage $V_b$ by decreasing charge on the selected bit line. Any perturbation in voltages on the bit lines is sensed to read the memory.

In a variation of the method, the voltages $V_s$ and $V_b$ are established so that $V_s + V_1 \leq V_b + V_{sb}$ and $V_b \leq V_s + V_{bs} + V_2$ to avoid reading or writing a memory cell other than the accessed memory cell on the selected select line, and to avoid reading or writing a memory cell on one of the select lines other than the selected select line.

In another embodiment, the invention is a method to write to a memory comprising a plurality of select lines and bit lines and a plurality of memory cells. Each of the memory cells is coupled between one of the select lines and one of the bit lines. Each of the memory cells also is characterized by a charge state that includes at different times a first voltage $V_1$ representing a first logical state and a second voltage $V_2$ representing a second logical state, the first voltage $V_1$ being greater than the second voltage $V_2$; and by voltage thresholds $V_{sb}$ and $V_{bs}$ when conducting current in different directions, $V_{sb}$ being in the direction of the select line to the bit line, and $V_{bs}$ being in the direction of the bit line to the select line. A voltage $V_s$ is established on a selected one of the select lines and a voltage $V_b$ is established on a selected one of the bit lines to access the memory cell coupled therebetween, a voltage differential being imposed across the accessed memory cell in the select-to-bit direction when $V_s > V_b$, and in the bit-to-select direction when $V_b > V_s$. The voltage differential is established at a magnitude to cause charge sharing between the accessed memory cell and the selected column line, the voltage differential being defined by $V_s + V^* + V_{bs} = V_b$ ($V^*$ being either $V_1$ or $V_2$) to raise the charge state of the accessed cell to $V^*$, and being defined by $V_s + V^* = V_{sb} + V_b$ to lower the charge state of the accessed cell to $V^*$.

In a variation of the method, the voltages $V_s$ and $V_b$ are established so that $V_s + V_1 \leq V_b + V_{sb}$ and $V_b \leq V_s + V_{bs} + V_2$ to avoid reading or writing a memory cell other than the accessed memory cell on the selected select line, and to avoid reading or writing a memory cell on one of the select lines other than the selected select line.

In another embodiment, the invention is a memory cell comprising first, second, third and fourth memory cell nodes, a stored charge device coupled between the first and second cell nodes, and first and second voltage dropping devices having a definite voltage drop while conducting in one direction and no ability to conduct in the opposite direction. The first voltage dropping device is coupled between the third cell node and the second cell node so that it conducts in the direction from the third to the second cell node. The second voltage dropping device is coupled between the second cell node and the fourth cell node so that it conducts in the direction from the second to the fourth cell node.

In another embodiment, the invention is a method for operating the memory cell of the prior paragraph, wherein the first cell node is coupled to a row select line and the third and fourth cell nodes are coupled to first and second column bit lines, respectively. The method comprises placing voltages on the row select line and the first and second column bit line at first times to cause the first voltage dropping device to conduct and to prevent the second voltage dropping device from conducting; and placing voltages on the row select line and the first and second column bit line at second times to cause the second voltage dropping device to conduct and to prevent the first voltage dropping device from conducting.

BRIEF DESCRIPTION OF THE DRAWINGS

In the drawings, wherein like reference characters indicate like parts.

DETAILED DESCRIPTION OF THE PREFERRED EMBODIMENT

Figure 3:
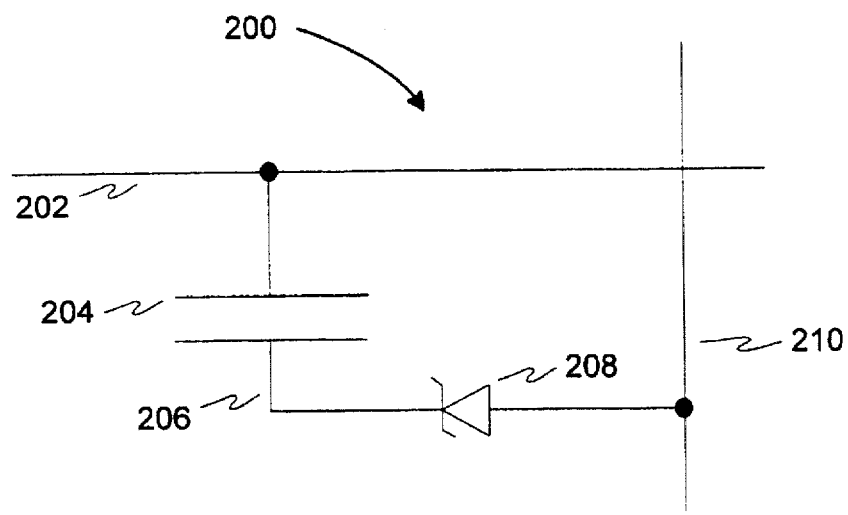
FIG. 3 is a dynamic memory cell in accordance with the present invention.

An extremely compact dynamic memory cell 200 is shown in FIG. 3. The cell includes a capacitor 204 and a Zener diode 208 connected between a Row Select line 202 and a Column Bit line 210. In general terms, the memory cell 200 includes any suitable stored charge device (inclusive of circuits that provide a stored charge function), of which the capacitor 204 is illustrative, connected in series with any suitable bi-directional voltage dropping device that exhibits substantially definite voltage drops when conducting in each direction (inclusive of circuits that provide such a function), of which the Zener diode 208 is illustrative. The term Zener diode is commonly used to mean any diode with a non-destructive reverse breakdown voltage, and this is the meaning applied here. Other suitable bi-directional devices having substantially definite voltage drops when conducting include reverse breakdown semiconductor diodes, metal-semiconductor junction (so-called Schottky barrier) diodes, vacuum tube diodes, and circuits such as back-to-back connected diodes.

The structures of the memory cell 200 are suitable for fabrication by any of a variety of processes used to fabricate conventional semiconductor DRAMs, and are replicated millions of times and arrayed in rows and columns as in conventional one-transistor MOSFET DRAM memories to form a memory integrated circuit. A row of cells is accessed by asserting the corresponding Row Select line, and columns are accessed by precharging the Column Bit lines. The cell read operation is a destructive read, necessitating a write-back operation to restore the original value. Circuits (not shown) suitable for controlling the Row Select and Column Bit line operations in such a memory are similar to those used in traditional one-transistor cell DRAMs, but are modified to apply suitable voltage sequences during idle periods and during memory read/rewrite and write operations.

The reading of a memory integrated circuit comprising an array of memory cells like the memory cell 200 is, in general terms, based on the recognition that the stored charge device nominally has either charge state $V_1$ or charge state $V_2$, charge state $V_1$ being greater than charge state $V_2$, and the voltage dropping device has two voltage thresholds $V_{sb}$ and $V_{bs}$ when conducting in different directions, $V_{sb}$ being in the direction of the row select line to the column bit line, and $V_{bs}$ being in the direction of the column bit line to the row select line. To sense the charge state of the stored charge device, establish a voltage differential between the row select line and the column bit line. Where $V_s$ is the voltage on the row select line and $V_b$ is the voltage on the column bit line, the voltage differential is established in the select-to-bit direction when $V_s > V_b$, and is established in the bit-to-select direction when $V_b > V_s$. Establish the magnitude of the voltage differential to cause a discharge for at least one of the logical states, the discharge being onto the bit line if $V_s > V_b$, and from the bit line if $V_b > V_s$, and also of a sufficient magnitude to be detected by a sense amplifier. The magnitude of the voltage differential may, if desired, be made sufficient to cause discharges for both logical states, provided one discharge is heavier than the other and the sense amplifier is able to distinguish between the larger and the smaller charge perturbation. For a discharge from the cell to the bit line, $V_s + V_1 > V_b + V_{sb}$. Alternatively, for a discharge from the bit line to the cell, $V_b > V_s + V_{bs} + V_2$. A combination of voltage differential in one direction followed by a differential in the other direction may also be used to perturb the bit line up or down selectively depending on the charge state $V_1$ or $V_2$, for detection by an appropriately designed sense amplifier.

The writing of a memory integrated circuit comprising an array of memory cells like the memory cell 200 is, in general terms, based on the recognition that the charge in the storage charge device is increased by creating a sufficient voltage differential in the bit-to-select direction $V_b > V_s$, so as to exceed the $V_{bs}$ voltage threshold of the voltage dropping device, and the charge in the storage charge device is decreased by creating a sufficient voltage differential in the select-to-bit direction $V_s > V_b$ so as to exceed the $V_{sb}$ voltage threshold of the voltage dropping device. To write a charge state corresponding to $V^*$ into the memory cell 200, where $V^*$ is either $V_1$ or $V_2$, create a voltage differential between the word select line and the column bit line in the appropriate direction to raise or lower the voltage as desired on the stored charge device. For example, if $V_1 > V_2$, the relationship of $V_s$ to $V_b$ is determined by $V_s + V^* + V_{bs} = V_b$ to raise the voltage on the stored charge device to $V^*$, and is determined by $V_s + V^* = V_{sb} + V_b$ to lower the voltage on the stored charge device to $V^*$. The voltage differential is maintained so that the cell 200 charges to $V^*$ and the voltage dropping device ceases to conduct.

To avoid reading or writing memory cells on a particular word select line, whether during idling, or when reading or writing other rows, or even when reading or writing to other cells on the particular word select line, the following voltage relationships are established: $V_s + V_1 \leq V_b + V_{sb}$ and $V_b \leq V_s + V_{bs} + V_2$.

Figure 4:
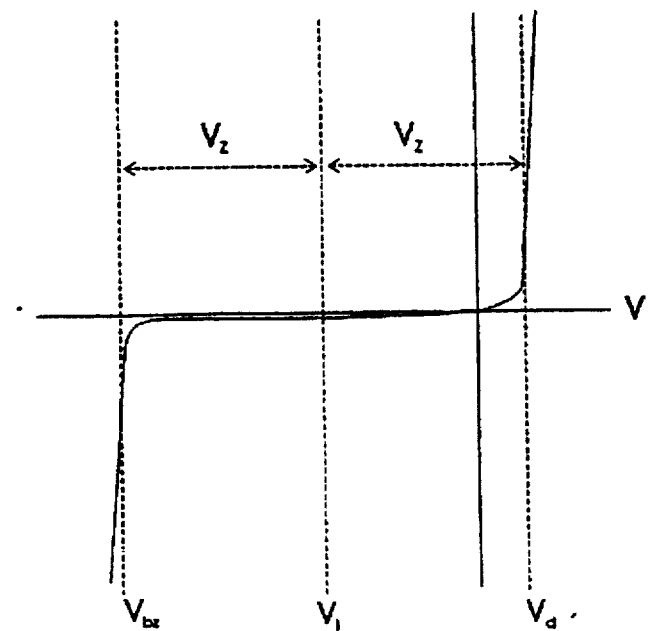
FIG. 4 is a graph showing certain voltage characteristics of the memory cell of FIG. 3.

An illustrative voltage sequence for operating the dynamic memory cell 200 of FIG. 3 in its various modes is now described under an assumption of ideal devices and conditions. The voltages used in practice vary in accordance with the semiconductor fabrication processes and the device structures used for the memory cell 200, in accordance with well known principles. The bit is stored as a charge on the capacitor 204, and appears as voltage $V_c$ at node 206. As shown in FIG. 4, the Zener diode 208 has a Zener breakdown voltage of magnitude $V_{bz}$, and a typically small forward turn-on voltage of magnitude $V_d$. When the cell is not being accessed, the Row Select line 202 is held at a voltage $V_i$, which preferably is halfway between $V_{bz}$ and $V_d$. The charge stored on the capacitor 204 for a logical 0 is zero, resulting in a voltage at node 206 of $V_c = V_i$. The charge stored on the capacitor 204 for a logical 1 is the voltage $V_z$, resulting in a voltage at node 206 of $V_c = V_i + V_z$. The voltage $V_z$ is preferably half the difference between the forward turn-on voltage and the point of Zener breakdown of the diode, $V_{bz}$, so $V_{bz} + V_d = 2V_z$. Consequently $V_i = V_{bz} - V_z = V_z - V_d$. These voltages are shown in FIG. 4.

While the row and column are not being accessed, the Row Select line 202 and the Column Bit line 210 are at $V_i$. Thus the Zener diode 208 sees either no drop if the value stored in the memory cell 200 is a logical 0, or a drop of $V_z$ in the reverse direction if the value stored in the memory cell 200 is a logical 1. Therefore there is no charge loss from the capacitor 204 to the Column Bit line 210. Assuming $V_{bz} = 5.0$ volts and $V_d = 0.7$ volts, and assuming ideal device and line characteristics, the voltage $V_c$ at node 206 for logical 0 and 1 during the idle, read (of other cells not in the same row or column), and rewrite (of other cells not in the same row or column) modes of operation are listed in Table 1, wherein $V_{rsl}$ is the voltage on the Row Select line 202 and $V_{cbl}$ is the voltage on the Column Bit line 202.

TABLE 1

| NON-SELECTED CELL | | | | | | |
|---|---|---|---|---|---|---|
| LOGICAL 0 | | | PARAMETER | LOGICAL 1 | | |
| IDLE MODE | READ MODE | REWRITE MODE | $V_{bz}$ = 5.0 volts $V_d$ = 0.7 volts | IDLE MODE | READ MODE | REWRITE MODE |
| 2.15 | 2.15 | 2.15 | $V_{rsl}$ | 2.15 | 2.15 | 2.15 |
| 2.15 | 2.15 | 2.15 | $V_c$ | 5.0 | 5.0 | 5.0 |
| 2.15 | 2.15 | 2.15 | $V_{cbl}$ | 2.15 | 2.15 | 2.15 |

In order to read the charge on the capacitor 204, the Row Select line 202 is lowered to $V_i - V_z - V_d$. If the voltage at node 206 was $V_i + V_z$ (i.e. logical 1 with a charge of $V_z$ volts on the capacitor), it is now $V_i - V_d$. Since the drop from the Column Bit line 210 to node 206 is $V_i - (V_i - V_d) = V_d$, no charge transfers from the Column Bit line 210 to the capacitor 204. If, on the other hand, the voltage at node 206 was $V_i$ (i.e. logical 0 with no charge on the capacitor), it is now $V_i - V_z - V_d$, or a drop of $V_z + V_d$ in the forward direction. Zener diode 208 turns on in the forward direction, and the capacitor 204 discharges the Column Bit line 210, thereby dropping its voltage slightly. The slight voltage drop is picked up by a sense amplifier (not shown). Node 206 charges until its voltage reaches $V_i - V_d$. The net increase in voltage at node 206 is $\Delta V_c = V_i - V_d - (V_i - V_z - V_d) = V_z$. The voltage $V_c$ at node 206 for logical 0 and 1 during the read mode of operation are listed in Table 2.

TABLE 2

| | SELECTED CELL | | | | | |
|---|---|---|---|---|---|---|
| | LOGICAL 0 | | PARAMETER | LOGICAL 1 | | |
| IDLE MODE | READ MODE | REWRITE MODE | $V_{bz}$ = 5.0 volts<br>$V_d$ = 0.7 volts | IDLE MODE | READ MODE | REWRITE MODE |
| 2.15 | −1.4 | 5.0 | $V_{rsl}$ | 2.15 | −1.4 | 5.0 |
| 2.15 | −1.4 → 1.45 | 7.85 → 5.0 | $V_c$ | 5.0 | 1.45 | 7.85 |
| 2.15 | 2.15 | 0 | $V_{cbl}$ | 2.15 | 2.15 | 2.85 |

In order to insure that the cell does reach preferably a full logical 1 value, the Column Bit line 210 is briefly driven to $V_i$ after the cell value is sensed to eliminate the effect of any dip in voltage caused by the reading process. The read of the logical 0 value is destructive, so the device must be rewritten. All the capacitors 204 in the selected row have a logical 1 value after a read operation, since they have a $V_z$ volt differential with the Row Select line. To write a logical 0 back to the capacitor 204, the Row Select line 202 is raised to a voltage $V_i+V_z$ while the Column Bit line 210 is lowered to a voltage $V_i-V_z+V_d$. The Zener diode 208 now operates in the reverse breakdown Zener mode since there is a $V_{bz}=2V_z-V_d$ voltage differential between the Row Select line 202 and the Column Bit line 210. Charge on the capacitor 204 is removed until $V_c=V_i+V_z$, so that the capacitor 204 becomes completely discharged. To write a logical 1 to the capacitor 204, raise the Row Select line 202 to a voltage $V_i+V_z$ and raise the Column Bit line 210 to $V_i+V_d$. Because of the $V_z$ volt differential across the capacitor 204 with the Row Select line 202, the voltage at the Zener diode 208 becomes $V_{bz}=2V_z-V_d$ volts above the Column Bit line 210, which does not allow the Zener diode 208 to discharge the capacitor 204 further. The logical 1 is retained. The voltage $V_c$ at node 206 for logical 0 and 1 during the rewrite mode of operation are listed in Table 2.

The Row Select lines 202 of the non-selected rows are kept at $V_i$ during the Read cycle. When a rewrite of a logical 0 is done, the voltage differential across the Zener diodes 208 in the memory cells 200 associated with the non-selected rows but on the same column as the rewrite is either $V_z-V_d<V_{bz}$ for a stored logical 0 or $2V_z-V_d=V_{bz}$ in the reverse direction for a stored logical 1, so no charge is transferred from the other cells. When a rewrite of a logical 1 is done, the voltage differential across the Zener diodes 208 in the memory cells 200 associated with the nonselected rows but on the same column as the rewrite is either $V_d$ forward for a stored logical 0 or $V_z-V_d<V_{bz}$ in the reverse direction for a stored logical 1, so no charge is transferred from the other cells. The voltage $V_c$ at node 206 for logical 0 and 1 during the idle, read, and rewrite mode of operation for memory cells 200 that are on non-selected rows but share columns with a selected row are listed in Table 3.

TABLE 3

| | NON-SELECTED CELL ON SAME COLUMN AS SELECTED CELL | | | | | |
|---|---|---|---|---|---|---|
| | LOGICAL 0 | | PARAMETER | LOGICAL 1 | | |
| IDLE MODE | READ MODE | REWRITE MODE | $V_{bz}$ = 5.0 volts<br>$V_d$ = 0.7 volts | IDLE MODE | READ MODE | REWRITE MODE |
| 2.15 | 2.15 | 2.15 | $V_{rsl}$ | 2.15 | 2.15 | 2.15 |
| 2.15 | 2.15 | 2.15 | $V_c$ | 5.0 | 5.0 | 5.0 |
| 2.15 | 2.15 | 0 (0)<br>2.85 (1) | $V_{cbl}$ | 2.15 | 2.15 | 0 (0)<br>2.85 (1) |

Since the voltage changes on the Row Select line 202, coupled with the Column Bit line 210, result in a write, an entire row can be rewritten in this fashion. The above sequence of operations constitute a complete Read cycle, allowing individual cell values to be read while retaining at the end of the cycle the original values in every cell unchanged.

In order to perform a Write operation to a cell, the above Read cycle is performed in the same manner, except that when the cells are rewritten the one cell whose value is to be changed has the new value written into it instead of the old value. All other cells will retain the old values.

Since some current leakage across the diodes occurs over time, the memory cells 200 preferably are refreshed periodically, as in a standard DRAM. This is done by performing the above complete Read cycle on every row in the memory, one row at a time, thus bringing the voltage levels back to full value.

An alternate embodiment of the accessing process, whether for a Read cycle or a Write cycle, allows individual cells to be accessed. The modification is as follows. In order to read the charge, the Row Select line 202 is lowered to $V_i-V_z-V_d$, and if the cell is to be read, the corresponding Column Bit line 210 remains at a voltage of $V_i$. Thus for the cell being accessed, the reading process is unchanged from the previous description. To prevent the other cells in the row from being accessed by their Column Bit lines 210, these other Column Bit lines 210 are lowered simultaneously with the Row Select line 202 to a voltage of $V_i-V_z-V_d$, so that no charge is transferred into the other cells. Note that there is a drop of at most $V_i+V_z-(V_i-V_z-V_d)=2V_z-V_d=V_{bz}$ in the reverse direction across the diodes in the other rows (taking into consideration the possible stored charge for a logical 1), so they too do not discharge onto the Column Bit lines 210. Thus individually chosen cells in a row can be accessed without accessing the other cells. If the cycle is a Read Cycle, these cells alone need to be rewritten with logical 0's if appropriate. If a logical 1 is to remain in the cell, the rewriting can be dispensed with. If a cell is to be written to, the reading process described above inserts a logical 1, while the writing process described previously places a logical 0. Only one or the other need be done if only a single cell is being accessed. Thus the Read and Write Cycles may be speeded up.

If only isolated cells are to be accessed, the number of sense amplifiers used is reduced by multiplexing, since one sense amplifier may be shared by many columns. The need to refresh the entire memory dictates how many sense amplifiers are needed, since refreshing one cell at a time is slow. Advantageously, this technique avoids the placing of a sense amplifier at each column.

EXAMPLE

Figure 5:
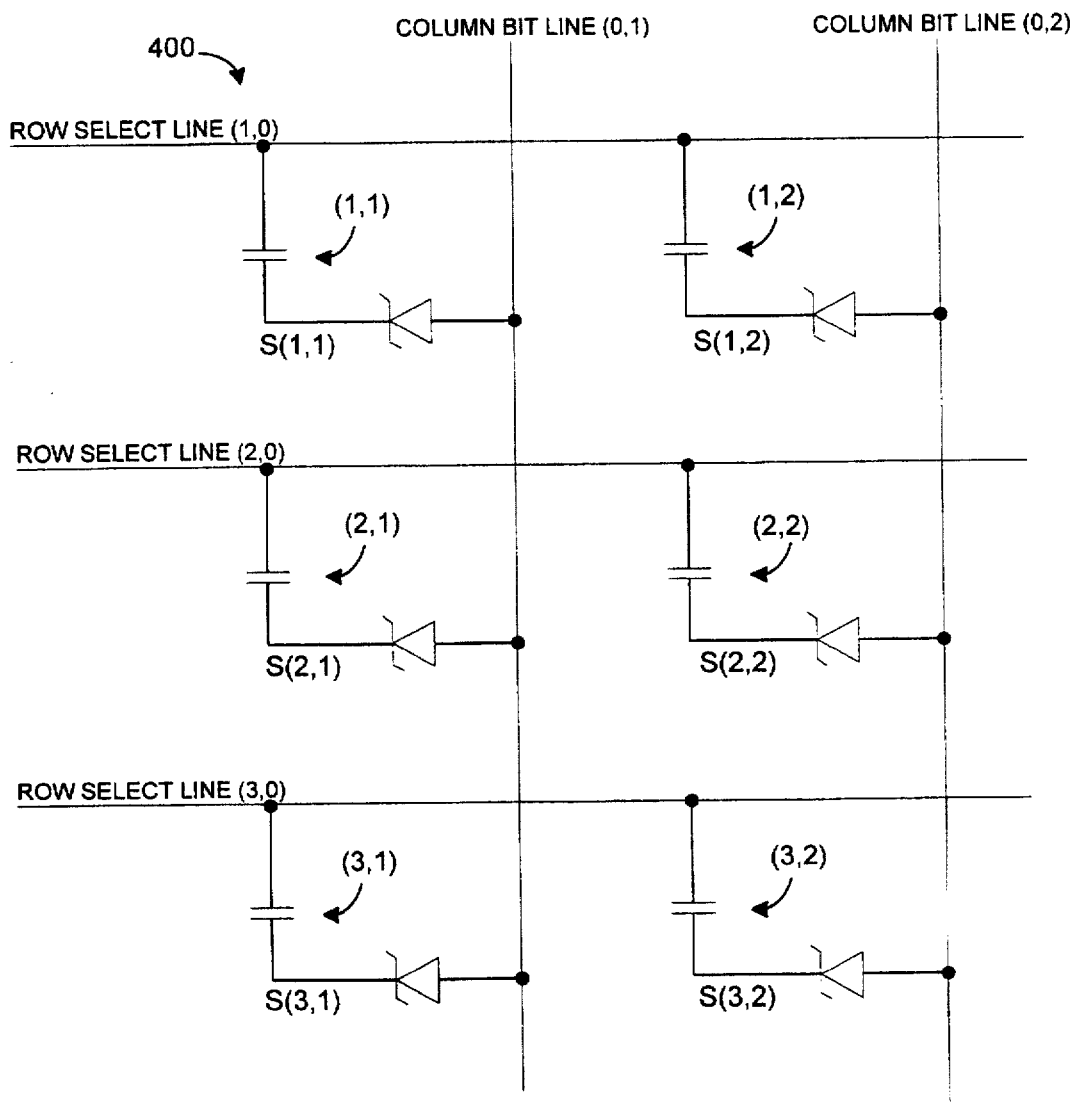
FIG. 5 is a schematic diagram of an array of memory cells like the memory cell of FIG. 3.

The circuit 400 shown in FIG. 5 represents an array containing memory cells of the type shown in FIG. 3. The array contains six bits arranged in three rows of two bits each. The circuit 400 was simulated using the P-SPICE circuit simulation package, with the Zener Diode 208 specified as having a reverse breakdown voltage $V_{bz}$ of 5 volts and a forward turn-on voltage $V_d$ of 0.7 volts. The capacitor 204 was assigned a value of 15 femtofarads, and the Column Bit line 210 was assigned an infinite capacitance consistent with a large line. The diode 208 was given a saturation current value of $I_s=4\times10^{-23}$ amps, corresponding to a small semiconductor diode of about 4 square microns. The reverse breakdown knee voltage of the diode was set at 5 volts, which corresponds to $V_{bz}=5$ volts. The stable high voltage at node 206 was found to be about 4.95 volts, and the stable low voltage was found to be about 2.2 volts. These values differ slightly from the values strictly dictated by the formulas set forth elsewhere herein because the values of $V_{bz}$ and $V_d$ are nominal values; for the Zener diode 208 of the simulation as well as actual Zener diodes, the turn on voltage is not a single voltage but in fact varies over a range of voltages. This causes some leakage until a stable value (defined as a value for which the leakage is insignificant except over very long periods of time) is obtained. The problem of long term leakage is handled by the refreshing process.

Figure 6:
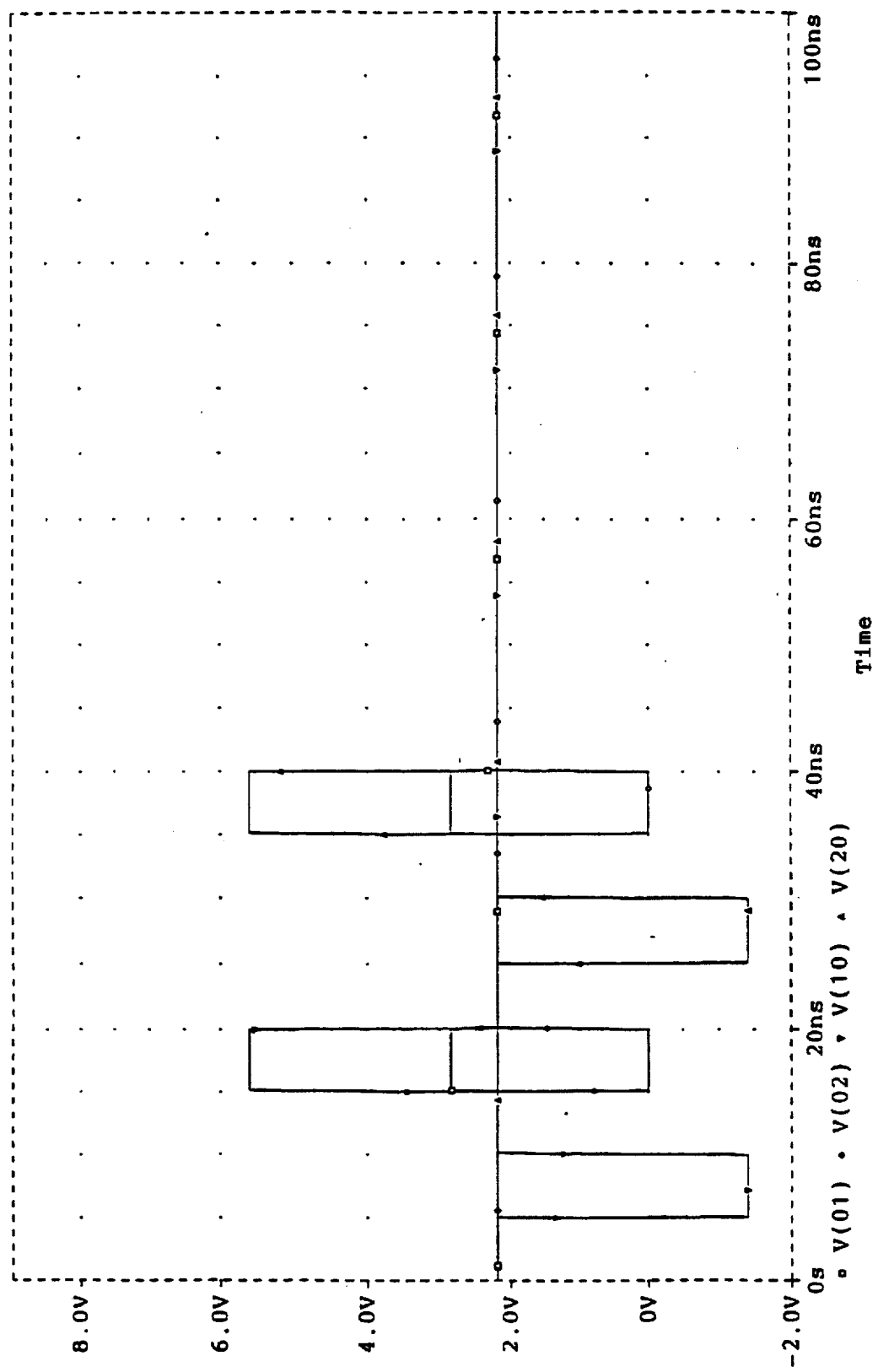
FIGS. 6, 7, 8 and 9 are graphs showing sequences of voltages to operate the memory array of FIG. 5 in various modes of operation.
Figure 7:
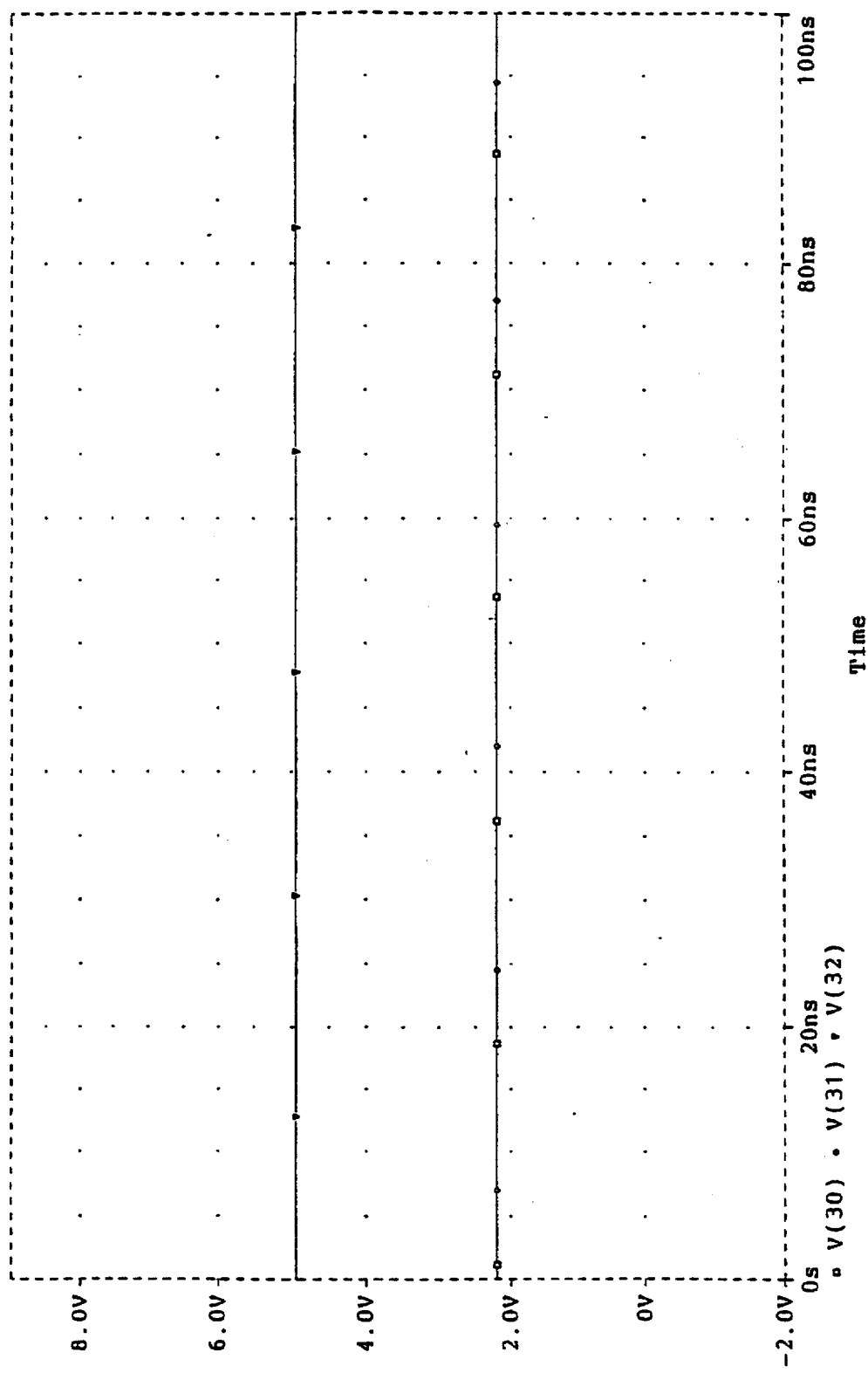
Figure 8:
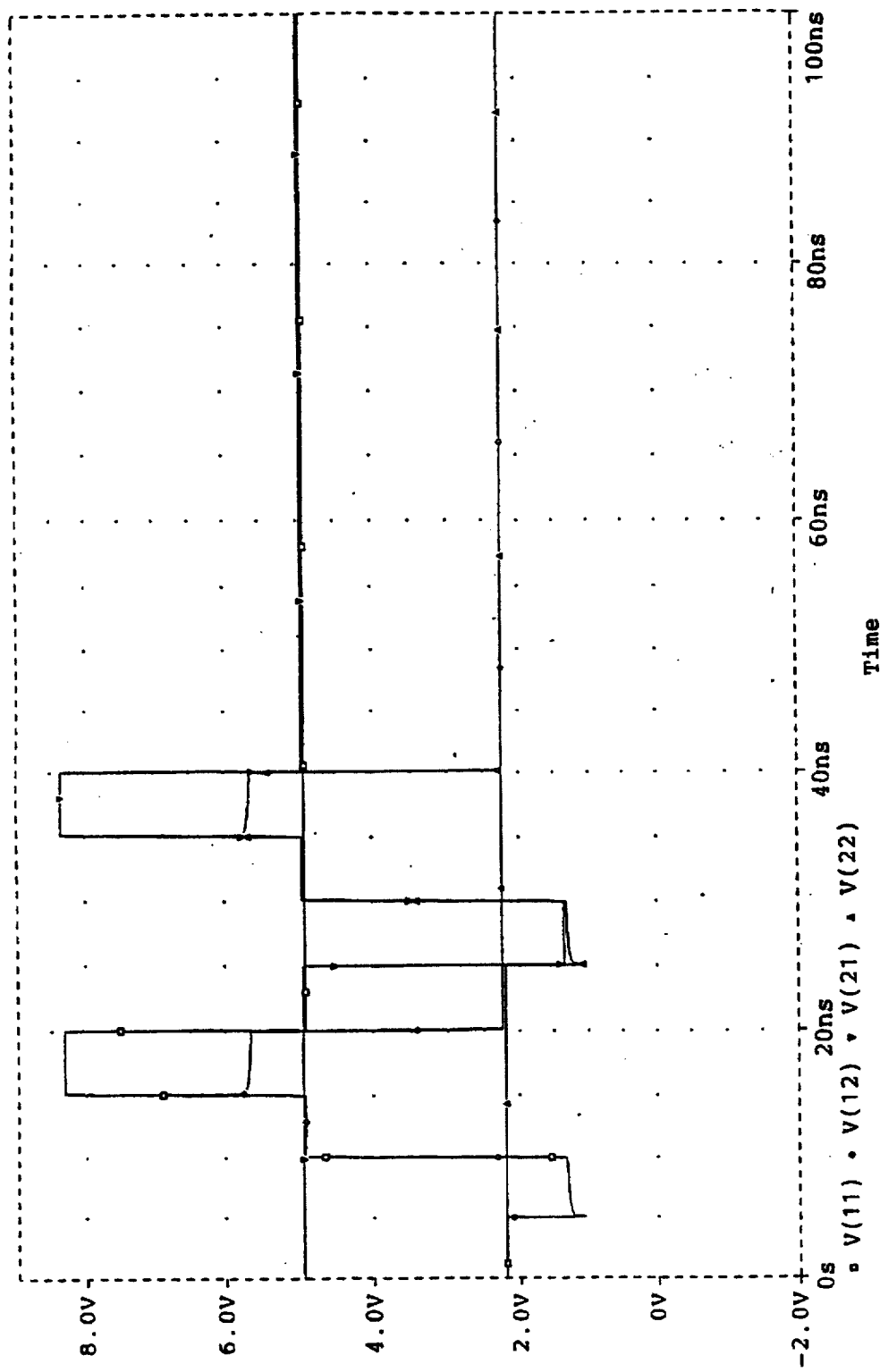

The simulations were run for a period of 100 ns (nanoseconds), with two complete cycles carried out during the period. The various voltages on the Column Bit lines and the Row Select lines of the circuit 400 during the period are shown in FIG. 6 and FIG. 7: V(0,1) and V(0,2) are the Column Bit line voltages, and V(1,0), V(2,0) and V(3,0) are the Row Select line voltages. The voltages on the nodes 206 of the various memory cells are shown in FIG. 7 and FIG. 8. In FIG. 8, V(1,1) and V(1,2) are the values at nodes S(1,1) and S(1,2) for the two cells of the first row (1,0), and V(2,1) and V(2,2) are the values at nodes S(2,1) and S(2,2) for the two cells of the second row (2,0). In FIG. 7, V(3,1) and V(3,2) are the values at nodes S(3,1) and S(3,2) for the two cells of the third row 3,0.

Initially, the memory cells (2,1) (row 2, column 1) and (3,2) (row 3, column 2) stored a logical 1 value so that node S(2,1) and node S(3,2) were at 4.95 volts. The other cells stored a logical 0 so that node S(1,1), node S(1,2), node S(2,2) and node S(3,1) were at 2.2 volts. In the first 20 ns a Write cycle was performed on row (1,0) involving the steps of reading the contents of the row, writing back the old value into cell (1,2), and overwriting cell (1,1) with a logical 1 at 4.95 volts. In the second 20 nanoseconds, a Read cycle was performed on row (2,0), involving the steps of reading and rewriting the contents of row (2,0). Row (3,0) was not accessed and its values were unaffected, except for slight leakage over time.

The first Read cycle was initiated with row (1,0), with V(1,0) being lowered from the idle voltage of 2.2 volts to −1.4 volts from 5 nanoseconds to 10 nanoseconds. Both V(1,1) and V(1,2) in FIG. 8 reached 1.4 volts, evidencing that a destructive read occurred. The destructive read became apparent at 10 nanoseconds when the Row Select line returned to the idle voltage of 2.2 volts, as both V(1,1) and V(1,2) reached 4.95 volts. At 15 nanoseconds, the Column Bit line voltage V(0,1) (FIG. 6) was raised to 2.85 volts, for a logical 1, while the Column Bit line voltage V(0,2) (FIG. 6) was reduced to 0 volts, or logical 0. At the same time, the Row Select line voltage V(1,0) was raised to 5.6 volts, so that V(1,1) (FIG. 8) rose to about 8.3 volts while V(1,2), (FIG. 8) fell to about 5.6 volts. Note that 5.6 volts is higher than the calculated 5 volts, since it was chosen to produce simulation stored charge voltages of 2.2 volts for a logical 0 and 4.95 volts for a logical 1 which most closely matched the predicted values. At 20 nanoseconds, the Row Select line (1,0) and the Column Bit line (0,2) returned to the idle voltage of 2.2 volts, causing V(1,1) to return to 4.95 volts, a logical 1, and causing V(1,2) to return to 2.2 volts, a logical 0.

During the period from 0 to 20 nanoseconds, the two cells in the second row, cell (2,1) and (2,2), were unchanged, with V(2,1) high (logical 1) and V(2,2) low (logical 0). Similarly, the two cells in the third row, cell (3,1) and cell (3,2), were unchanged, with V(3,1) low (logical 0) and V(3,2) high (logical 1). As the third row was never accessed in the simulation, cell (3,1) retained the logical 0 as V(3,1) and remained low throughout the simulation, while cell (3,2) retained a logical 1 as V(3,2) and remained high throughout the simulation; see FIG. 7. Note that both voltages V(3,1) and V(3,2) experienced a slow decay over time. Refresh is required to address this slow decay over time.

The second Read cycle was the same as the first Read cycle, but performed on row (2,0). V(2,0) was lowered to −1.4 volts from 25 to 30 nanoseconds, then raised to the idle voltage of 2.2 volts from 30 to 35 nanoseconds, then raised to 5.6 volts from 35 to 40 nanoseconds as V(0,2) was lowered to 0 volts, causing a logical 0 to be placed in cell (2,2) while cell (2,1) retained a logical 1. At just after 25 nanoseconds both V(2,1) and V(2,2) reached 1.4 volts, then at 30 nanoseconds rose to 4.95 volts, representing a logical 1. Note that V(2,2) was overwritten, since it was a logical 0 before this move. At 35 nanoseconds the rewriting process took place, and V(2,1) retained its logical 1 while V(2,2) was rewritten with a logical 0. At 40 nanoseconds the cycle ended with the values fixed at 4.95 volts for logical 1 or 2.2 volts for logical 0.

Figure 9:
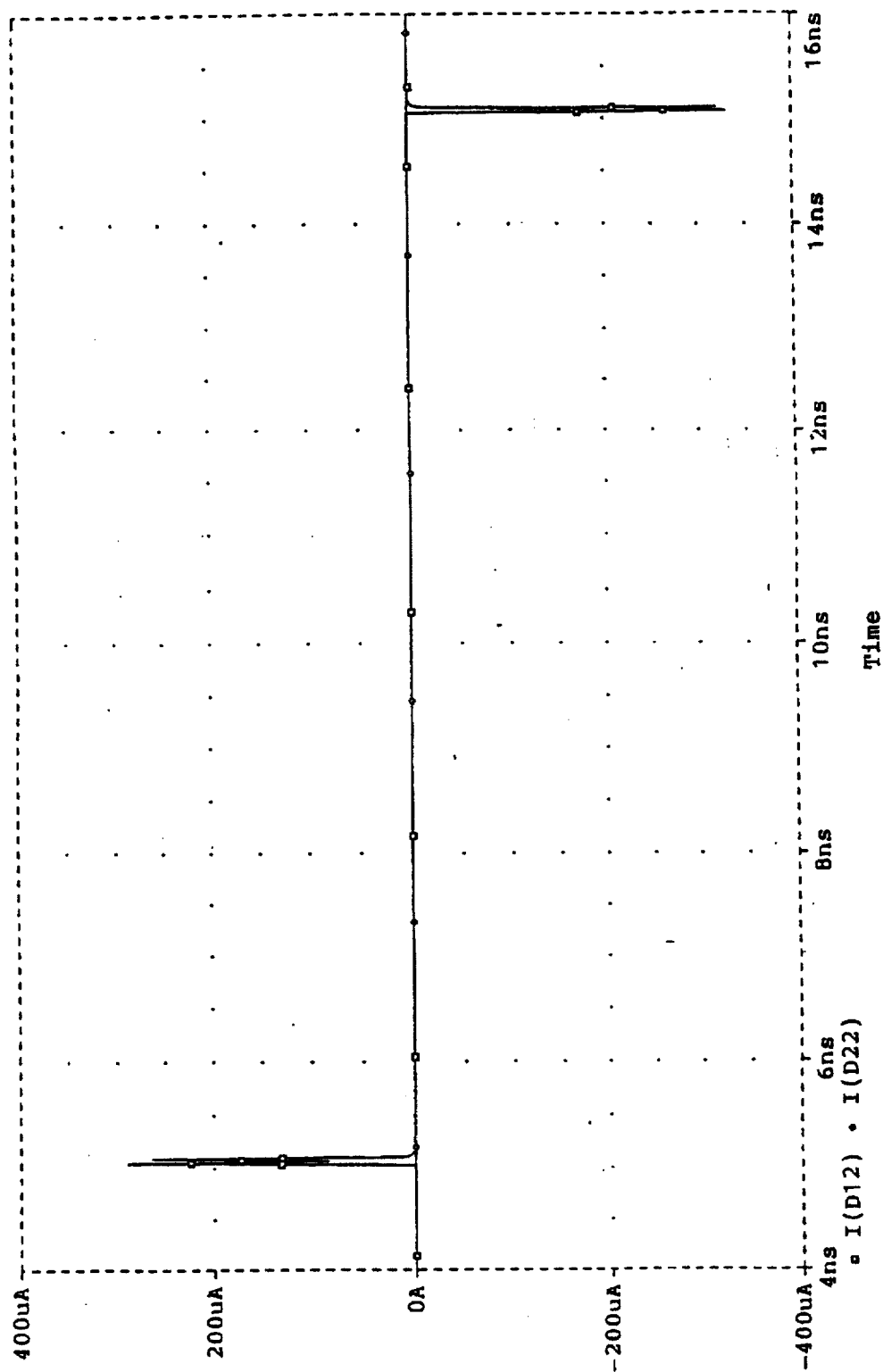

FIG. 9 is a plot of the currents through the diodes at cell (1,2) and cell (2,2). Since cell (2,2) was not accessed during the first 20 nanoseconds, its current is 0 mA. The current through the diode connected to cell (1,2) consisted of two short pulses of approximately 100 picoseconds each, the first one indicating charging of the cell due to the reading process, and the second indicating discharging of the cell as the cell is returned to its original value during rewriting. These currents, while small, are similar to the currents seen in typical conventional DRAM circuits and are readily detectable by standard sense-amplifier circuits of the type used in conventional ordinary one-transistor DRAMs.

OTHER EMBODIMENTS

Figure 10:
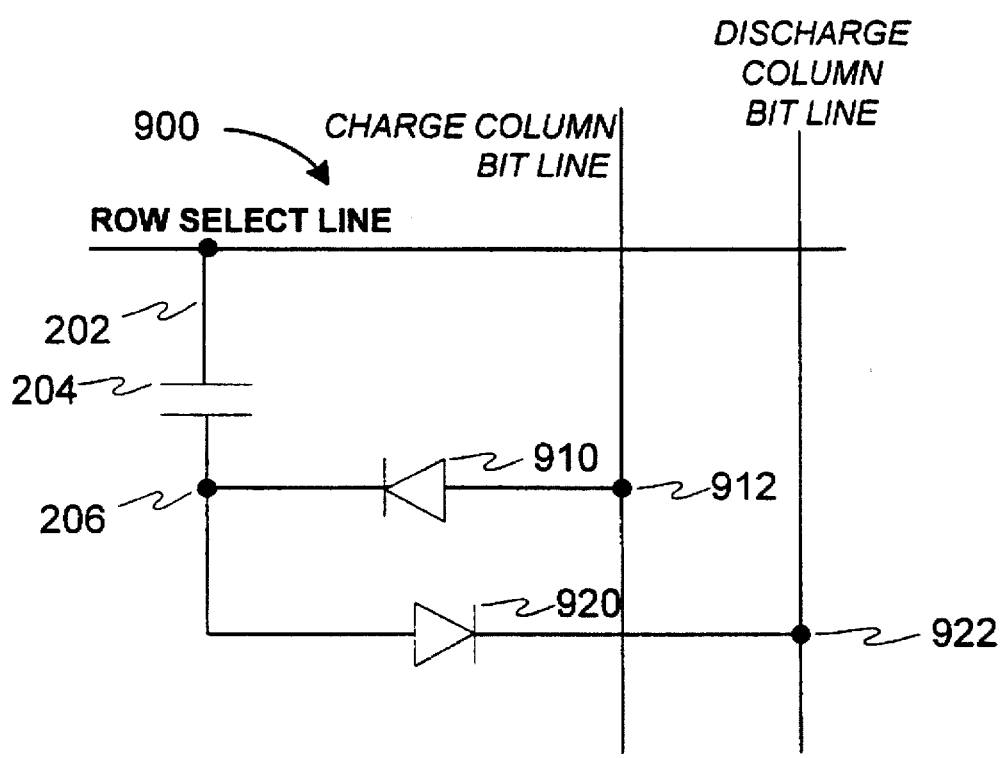
FIG. 10 is a schematic diagram of another embodiment of a dynamic memory cell in accordance with the present invention.

An alternate embodiment of a memory cell is illustrated in FIG. 10. In the memory cell 900 of FIG. 10, the Zener diode 208 of the circuit 200 (FIG. 3) has been replaced by two ordinary diodes, a read diode 910 and a write diode 920. The read diode 910 is connected to a read Column Bit line 912, and is forward-conductive from the line 912 to the capacitor 204. The write diode 920 is connected to a write Column Bit line 922, and is forward-conductive from the capacitor 204 to the line 922.

The read Column Bit Line 912 is used for the reading operation in the same manner as described above, with the same voltages applied to the Column Bit line 912. The stored charge is accessed through diode 910, charging the cell capacitor 204 from the Column Bit Line 912. During the reading operation and when not accessing the memory, the write Column Bit Line 922 is held at a voltage at or above $V_i+2V_z$, thus insuring that no current flows into it from the stored charge which has been accessed even when the cell contents of the entire row are replaced by logical 1. In order to rewrite the row, the Row Select line 202 is raised to a voltage of $V_i+V_z$. If a logical 1 is to be left in the cell 900, the Column Bit line 922 is held at or above $V_i+2V_z$ so that its voltage is at or above the maximum voltage of the stored charge, which is also $V_i+2V_z$. If a logical 0 is to be written into the cell 900, the voltage of the corresponding Column Bit line 922 is lowered to $V_i+V_z$ so that the stored charge is completely discharged through the diode 920. During this rewriting operation the voltage at the read Column Bit line 912 is held at $V_i$, so that no current flows through it. Note that since the voltage at the write Column Bit line 922 never drops below $V_i+V_z$, the cells in the other rows are not affected by the rewriting operation, since the maximum voltage at these stored charges is at $V_i+V_z$.

Figure 1:
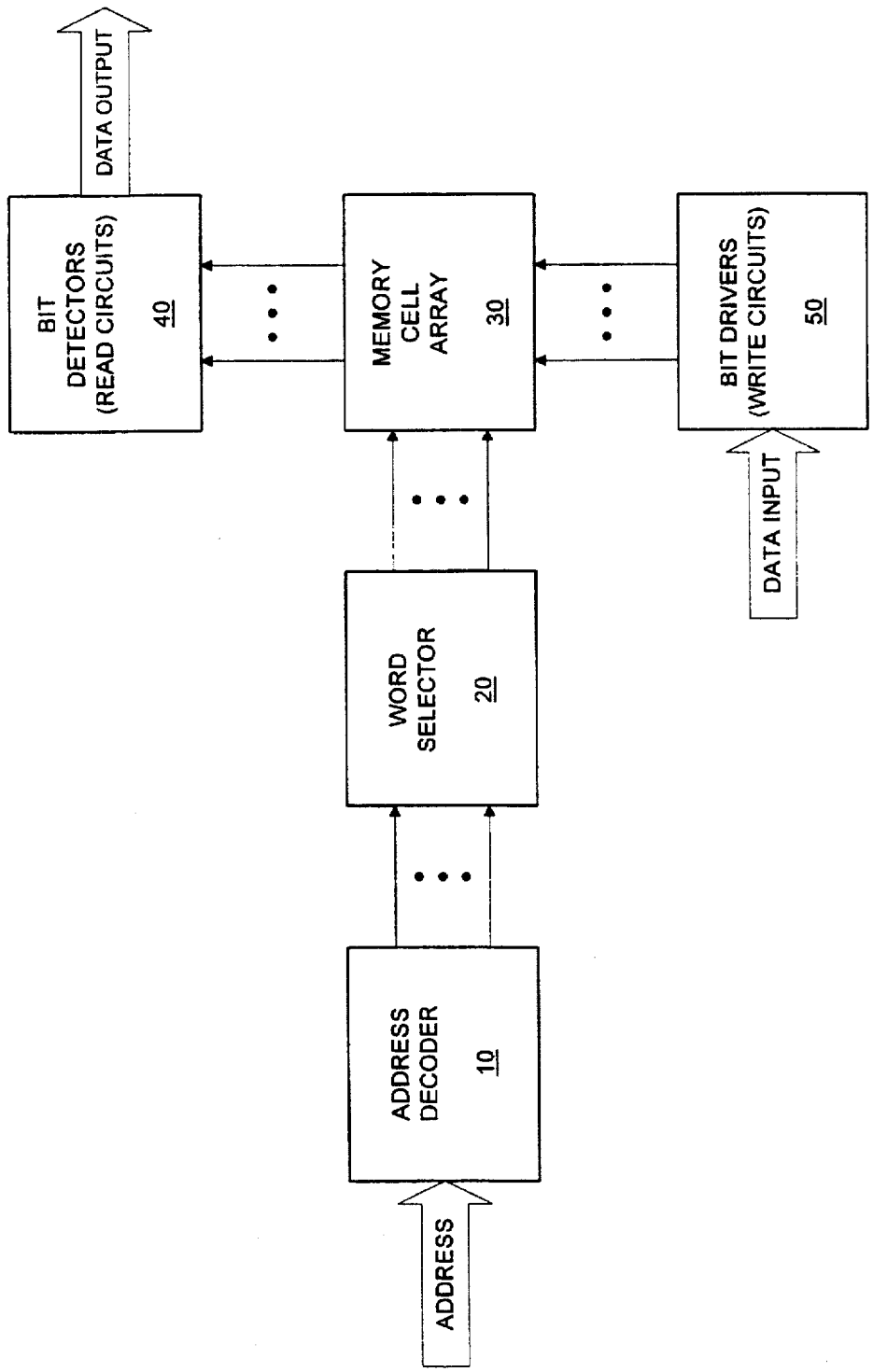
FIG. 1 is a block diagram of a prior art DRAM memory.
Figure 2:
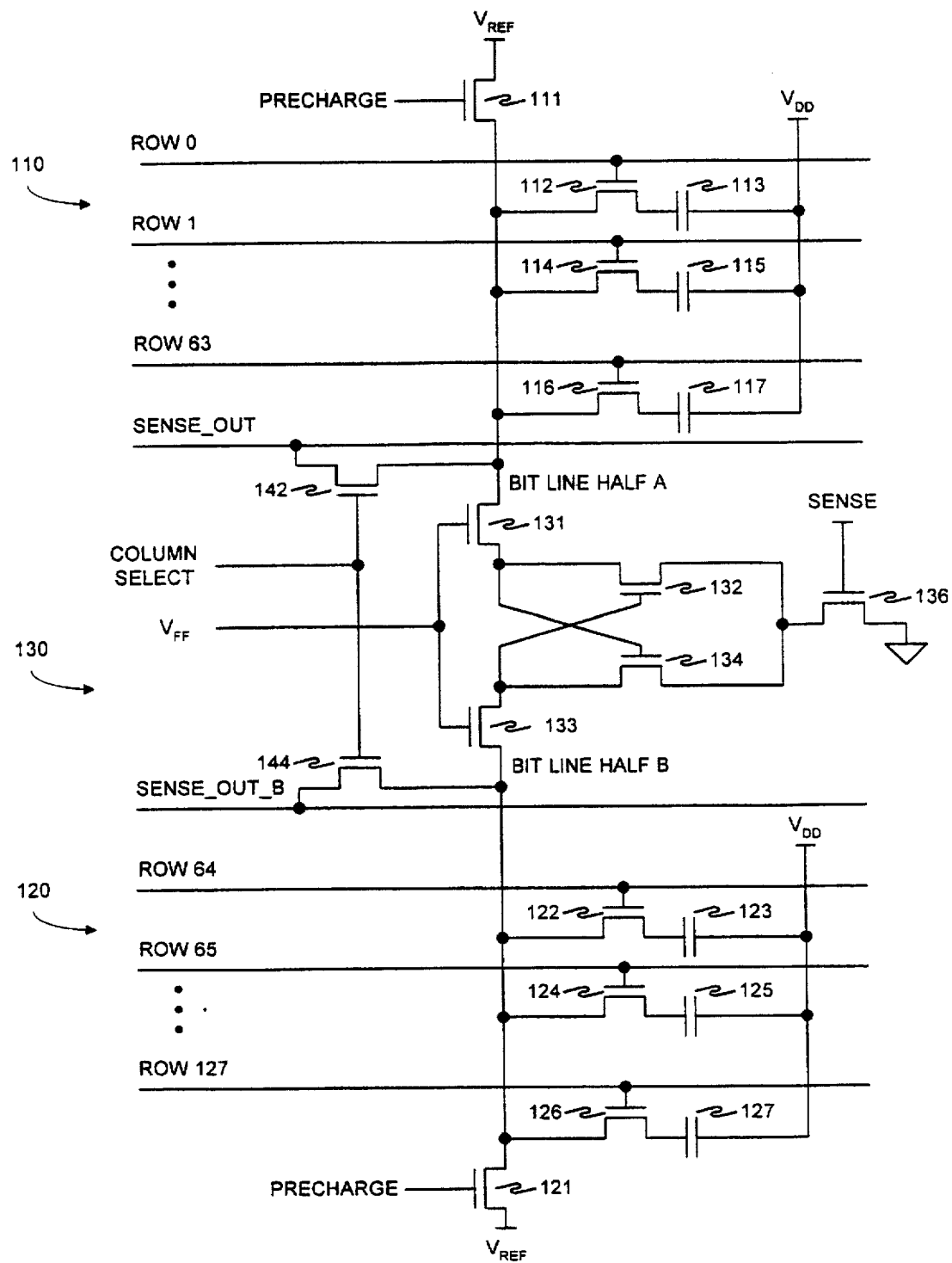
FIG. 2 is a schematic diagram of a prior art DRAM memory column.
Figure 11:
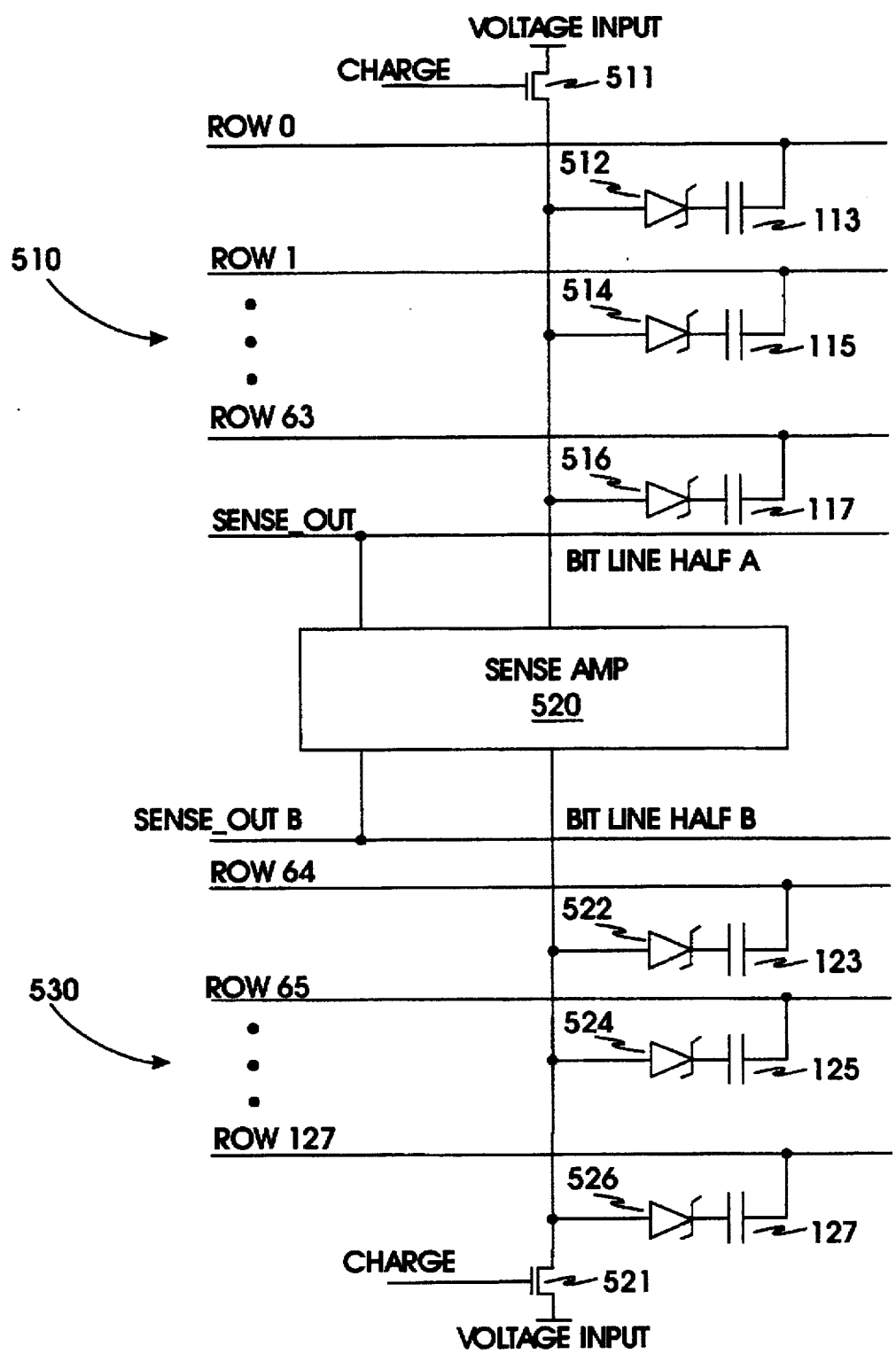
FIG. 11 is a schematic diagram showing how the present invention is incorporated into a DRAM memory.

FIG. 11 shows the circuit of FIG. 3 incorporated into a typical DRAM circuit. The individual cell transistors 112, 114, 116, 122, 124, and 126 of the prior art circuit of FIG. 2, for example, are replaced by Zener Diodes 512, 514, 516, 522, 524, and 526. The capacitors 113, 115, 117, 123, 125, and 127 of FIG. 2 are connected to their corresponding ROW 0, ROW 1, . . . , ROW 63, ROW 64, ROW 65, . . . , and ROW 127 lines on one end and on the other end to the diodes 512, 514, 516, 522, 524, and 526, respectively. The PRECHARGE transistors 111 and 121 with drain voltage $V_{REF}$ are replaced by transistors 511 and 521 with gate input CHARGE and a drain voltage VOLTAGE INPUT which is used at various times in the cycle to input one of the required voltages by raising the CHARGE line while gating in the appropriate drain voltage. The sense amp 520 is any suitable sense amplifier, such as, for example, a differential sense amplifier similar to the sense amplifier 130 of FIG. 2, or a pair of charge balance sense amplifiers such as described in Weste, Neil H. E. and Eshraghian, Kamran, Principles of CMOS VLSI Design: A System Perspective, Addison-Wesley Publishing Company, Reading, Mass., 1985, pp. 362–364, which is incorporated herein by reference. Where the sense amplifier 520 is a differential voltage sensing device and where the cell being accessed can either leave the Bit Line undisturbed or lower its voltage to some slightly lower voltage $V_L$, the proper sensing of a logical 1 requires that the unused Bit Line Half be precharged to a voltage in between $V_i$ and the lower voltage $V_L$. Thus a logical 1 will be sensed unless the cell charge lowers the voltage of the Bit Line Half being accessed. External power supply circuits well known to the art (not shown) are gated to feed the appropriate voltages in the required sequences to both the Rows and Column Bit lines.

The description of the invention set forth herein is illustrative, and does not limit the scope of the invention as set forth in the following claims. Variations and modifications of the embodiments disclosed herein are possible. For example, the capacitor and Zener diode of one of the embodiments are illustrative, and other devices having similar characteristics may be substituted. Moreover, the formulaic relationship of the voltages in the ideal case and the values of the voltages applied to the DRAM in its various modes of operation of the Example are illustrative, and not only may different voltage levels having the same relationships be used, but the relationships themselves are not critical. For example, where a negative voltage supply is not available, the voltages are scaleable so that positive voltages only can be used. As a further example, the relationships set forth establish idealy large and uniform buffer voltages between $V_c$ and $V_{rs1}$ and $V_{cb1}$, but other voltages that do not preserve such a buffer are contemplated as well. In another variation, the voltages may be applied with a different timing than set forth in the Example. Moreover, the designation of select line and bit line are arbitrary at the cell level, and the designations can be switched if desired. These and other variations and modifications of the embodiments disclosed herein may be made without departing from the scope and spirit of the invention.

What is claimed is:

1. A memory cell comprising:
   a first memory cell node;
   a second memory cell node;
   a stored charge device; and
   a voltage dropping device having asymmetrical substantially definite voltage drops while conducting in each direction;

wherein the stored charge device and the voltage dropping device are coupled in series between the first cell node and the second cell node.

2. A memory cell as in claim 1, wherein the stored charge device is a capacitor.

3. A memory cell as in claim 1, wherein the voltage dropping device is a Zener diode.

4. A memory cell as in claim 1, wherein the first cell node is a row select node and the second cell node is a column bit node.

5. A dynamic memory comprising:
   a plurality of memory cells arranged in an array and coupled to a plurality of word select lines and column bit lines, each memory cell having characteristics of a stored charge device that stores a voltage indicative of either a first or second logical state in series with a voltage dropping device that has asymmetrical substantially definite voltage drop characteristics $V_s$ and $V_w$ while conducting in each direction;

means for idling the memory by placing idle voltages on the word select lines and the column bit lines so that voltages across elements of the memory cells having the voltage dropping device characteristics do not exceed $V_s$ or $V_w$;

means for placing a voltage on a first one of the word select lines to access one of the memory cells coupled thereto, the voltage on the first word select line being of a value so that $V_s$ is exceeded across an element of the accessed cell having the voltage dropping device characteristics when the accessed cell is storing a first logical state to perturb the idle voltage on a first one of the column bit lines coupled to the accessed cell while voltages across elements of any others of the cells coupled to the first column bit line having the voltage dropping device characteristics do not exceed $V_s$ or $V_w$, and $V_s$ is not exceeded across the element of the accessed cell having the voltage dropping device characteristics when the accessed cell is storing a second logical state to avoid perturbing the idle voltage on the first column bit line; and means for sensing any perturbation in the first column bit line to determine the logical state of the accessed cell.

6. A dynamic memory comprising:

a plurality of memory cells arranged in an array and coupled to a plurality of word select lines and column bit lines, each memory cell having characteristics of a stored charge device that stores a voltage indicative of either a first or second logical state in series with a voltage dropping device that has asymmetrical substantially definite voltage drop characteristics $V_s$ and $V_w$ while conducting in each direction;

means for idling the memory by placing idle voltages on the word select lines and the column bit lines so that voltages across elements of the memory cells having the voltage dropping device characteristics do not exceed $V_s$ or $V_w$;

means for placing a voltage on a first one of the word select lines to access the memory cells coupled thereto; and means for placing a voltage indicative of either the first or second logical state on a first one of the column bit lines coupled to the selected cell while voltages across elements of any others of the cells coupled to the first column bit line having the voltage dropping device characteristics do not exceed $V_s$ or $V_w$;

wherein the voltage on the first word select line is of a value so that $V_s$ is exceeded across an element of the accessed cell having the voltage dropping device characteristics when the accessed cell is storing the first logical state and the voltage on the first column bit line is indicative of the second logical state, and $V_w$ is exceeded across an element of the accessed cell having the voltage dropping device characteristics when the accessed cell is storing the second logical state and the voltage on the first column bit line is indicative of the first logical state, and otherwise neither $V_s$ nor $V_w$ is exceeded across elements of any others of the cells coupled to the first column bit line having the voltage dropping device characteristics.

7. A dynamic memory comprising:

a plurality of row select lines;

a plurality of column bit lines;

a plurality of memory cells; wherein:

each memory cell is associated with one of the word select lines and one of the column bit lines so that at least two of the memory cells share a common word select line and at least two of the memory cells share a common column bit line; and each memory cell comprising a stored charge device and a voltage dropping device, the stored charge device and the voltage dropping device being serially coupled between the associated word select line and the associated column bit line, the stored charge device having a charge state indicative of either a first logical state or a second logical state, and the voltage dropping device being a bi-directional device having a substantially definite first voltage drop while conducting in one direction and a substantially definite second voltage drop while conducting in another direction, the first and second voltage drops being unequal;

means for initializing the word select lines to an idle voltage;

means for initializing a first subset of the column bit lines to a first precharge voltage, the relationship between the idle voltage and the first precharge voltage being such that voltages across the voltage dropping devices do not exceed the first and second voltage drops regardless of the charge state of the stored charge devices;

means for initializing a second subset of the column bit lines to a second precharge voltage, the relationship between the idle voltage and the second precharge voltage being such that voltages across the voltage dropping devices do not exceed the first and second voltage drops regardless of the charge state of the stored charge devices;

means for driving the common word select line to a read voltage to access the memory cells coupled to the common word select line, the read voltage having a value that in combination with the first precharge voltage and the charge state:

causes voltages across the voltage dropping devices of the memory cells coupled to the common word select line not to exceed the first or second voltage drops when the charge state is indicative of the first logical state, whereby the column bit lines coupled to the accessed memory cells having the first logical state are not perturbed; and causes voltage across the voltage dropping device of the memory cells coupled to the common word select line to exceed the second voltage drop when the charge state is indicative of the second logical state, whereby the column bit lines coupled to the accessed memory cells having the second logical state are perturbed and acquire a modified voltage, and the charge state of the accessed memory cells having the second logical state become indicative of the first logical state;

and the read voltage further having a value that in combination with the second precharge voltage and the charge state, voltages across the voltage dropping devices do not exceed the first or second voltage drops regardless of the charge state of the stored charge devices; and means for sensing the logical modes of the accessed memory cells based on whether the column bit lines are perturbed;

wherein the relationship between the idle voltage and the modified voltage is such that voltages across the voltage dropping devices do not exceed the first or second voltage drops regardless of the charge state of the stored charge devices.

8. A memory as in claim 7, further comprising:

means for driving the column bit lines to a logical mode-dependent voltage based on the sensed logical modes of the accessed memory cells; and means for driving the common word select line to a write voltage to rewrite the accessed memory cells;

the relationship between the charge state, the write voltage and the logical mode -dependent voltage being such that:

when the charge state and the logical mode -dependent voltage are indicative of the first logical state, voltages across the voltage dropping devices do not exceed the first or second voltage drops; and when the charge state is indicative of the first logical state and the logical mode -dependent voltage is indicative of the second logical state, voltages across the voltage dropping devices exceed the first voltage drop; and the relationship between the idle voltage and the logical mode -dependent voltage being such that voltages across the voltage dropping devices do not exceed the first or second voltage drops regardless of the charge state of the stored charge devices.

9. A dynamic memory comprising:

a plurality of row select lines;

a plurality of column bit lines;

a plurality of memory cells; wherein:

each memory cell is associated with one of the word select lines and one of the column bit lines so that at least two of the memory cells share a common word select line and at least two of the memory cells share a common column bit line; and each memory cell comprising a stored charge device and a voltage dropping device, the stored charge device and the voltage dropping device being serially coupled between the associated word select line and the associated column bit line, the stored charge device having a charge state indicative of either a first logical state or a second logical state, and the voltage dropping device being a bi-directional device having a substantially definite first voltage drop while conducting in one direction and a substantially definite second voltage drop while conducting in another direction, the first and second voltage drops being unequal;

means for driving the common word select line to a write voltage to write the accessed memory cells;

means for driving a first subset of the column bit lines to a logical mode -dependent voltage based on logical values of data to be written to the accessed memory cells; and means for driving a second subset of the column bit lines to a non-select voltage, the relationship between the write voltage and the non-select voltage being such that voltages across the voltage dropping devices do not exceed the first or second voltage drops regardless of the charge state of the stored charge devices;

the relationship between the charge state, the write voltage, and the logical mode -dependent voltage being such that:

when the charge state and the logical mode -dependent voltage are indicative of the first logical state, voltages across the voltage dropping devices do not exceed the first or second voltage drops; and when the charge state is indicative of the first logical state and the logical mode -dependent voltage is indicative of the second logical state, voltages across the voltage dropping devices exceed the first voltage drop.

10. A method to read a dynamic memory comprising a plurality of memory cells arranged in an array and coupled to a plurality of word select lines and column bit lines, each memory cell having characteristics of a stored charge device that stores a voltage indicative of either a first or second logical state in series with a voltage dropping device that has asymmetrical substantially definite voltage drop characteristics $V_s$ and $V_w$ while conducting in each direction, the method comprising:

idling the memory by placing idle voltages on the word select lines and the column bit lines so that voltages across elements of the memory cells having the voltage dropping device characteristics do not exceed $V_s$ or $V_w$;

placing a voltage on a first one of the word select lines to access one of the memory cells coupled thereto, the voltage on the first word select line being of a value so that $V_s$ is exceeded across an element of the accessed cell having the voltage dropping device characteristics when the accessed cell is storing a first logical state to perturb the idle voltage on a first one of the column bit lines coupled to the accessed cell while voltages across elements of any others of the cells coupled to the first column bit line having the voltage dropping device characteristics do not exceed $V_s$ or $V_w$, and $V_s$ is not exceeded across the element of the accessed cell having the voltage dropping device characteristics when the accessed cell is storing a second logical state to avoid perturbing the idle voltage on the first column bit line; and sensing any perturbation in the first column bit line to determine the logical state of the accessed cell.

11. A method to write a dynamic memory comprising a plurality of memory cells arranged in an array and coupled to a plurality of word select lines and column bit lines, each memory cell having characteristics of a stored charge device that stores a voltage indicative of either a first or second logical state in series with a voltage dropping device that has asymmetrical substantially definite voltage drops $V_s$ and $V_w$ while conducting in each direction, the method comprising:

idling the memory by placing idle voltages on the word select lines and the column bit lines so that voltages across elements of the memory cells having the voltage dropping device characteristics do not exceed $V_s$ or $V_w$;

placing a voltage on a first one of the word select lines to access at least one of the memory cells coupled thereto; and placing a voltage indicative of either the first or second logical state on a first one of the column bit lines coupled to the selected cell while voltages across elements of any of the cells other than the accessed cell coupled to the first column bit line having the voltage dropping device characteristics do not exceed $V_s$ or $V_w$; wherein the voltage on the first word select line is of a value so that $V_s$ is exceeded across an element of the accessed cell having the voltage dropping device characteristics when the accessed cell is storing the first logical state and the voltage on the first column bit line is indicative of the second logical state, and $V_w$ is exceeded across an element of the accessed cell having the voltage dropping device characteristics when the accessed cell is storing the second logical state and the voltage on the first column bit line is indicative of the first logical state.

12. A method to read a dynamic memory cell that comprises a cell select node, a bit node, a stored charge device, and a voltage dropping device, wherein the stored charge device and the voltage dropping device are serially coupled between the cell select node and the bit node, the stored charge device has either a first charge state indicative of a first logical state or a second charge state indicative of a second logical state, and the voltage dropping device has a substantially definite first voltage drop while conducting in a direction from the bit node to the cell select node, and a substantially definite second voltage drop while conducting in a direction from the cell select node to the bit node, the first and second voltage drops being unequal, the method comprising:

initializing the cell select node to an idle voltage;

initializing the bit node to a precharge voltage, the relationship between the idle voltage and the precharge voltage being such that voltage across the voltage dropping device does not exceed the first and second voltage drops;

driving the cell select node to a read voltage, the relationship between the read voltage and the precharge voltage being such that voltage across the voltage dropping device does not exceed the first and second voltage drops when the stored charge device has the first charge state, and voltage across the voltage dropping device exceeds the first voltage drop when the stored charge device has the second charge state to share charge between the stored charge device and the bit node, thereby perturbing the bit node and causing the stored charge device to have a modified charge state;

sensing the logical mode based on the perturbation of the bit node;

driving the bit node to a logical mode -dependent voltage based on the sensed logical mode; and driving the cell select node to a write voltage, the relationship between the write voltage and the logical mode -dependent voltage being such that when the stored charge device has the first charge state and the logical mode -dependent voltage reflects the first logical state, voltage across the voltage dropping device does not exceed the first and second voltage drops, while when the stored charge device has the modified charge state and the logical mode -dependent voltage reflects the second logical state, voltage across the voltage dropping device exceeds the second voltage drop to return the stored charge device to substantially the second charge state.

13. A method as in claim 12 wherein the modified charge state is substantially equal to the first charge state.

14. A method to write a data bit to a dynamic memory cell that comprises a cell select node, a bit node, a stored charge device, and a voltage dropping device, wherein the stored charge device and the voltage dropping device are serially coupled between the cell select node and the bit node, the stored charge device has either a first charge state indicative of a first logical state or a second charge state indicative of a second logical state or an intermediate charge state indicative of an indeterminate logical state, and the voltage dropping device has a substantially definite first voltage drop while conducting in a direction from the bit node to the cell select node, and a substantially definite second voltage drop while conducting in a direction from the cell select node to the bit node, the first and second voltage drops being unequal, the method comprising:

driving the bit node to a logical mode -dependent voltage based on the data bit; and driving the cell select node to a write voltage, the relationship between the write voltage and the logical mode -dependent voltage being such that when the stored charge device has the first charge state and the logical mode -dependent voltage reflects the first logical state, voltage across the voltage dropping device does not exceed the first and second voltage drops, while when the stored charge device has either the first charge state or the intermediate charge state and the logical mode -dependent voltage reflects the second logical state, voltage across the voltage dropping device exceeds the second voltage drop to set the stored charge device to the second charge state.

15. A method to access a dynamic memory comprising:
a plurality of row select lines;
a plurality of column bit lines; and
a plurality of memory cells;
wherein each memory cell is associated with one of the word select lines and one of the column bit lines so that at least two of the memory cells share a common word select line and at least two of the memory cells share a common column bit line; and wherein each memory cell comprising a stored charge device and a voltage dropping device, the stored charge device and the voltage dropping device being serially coupled between the associated word select line and the associated column bit line, the stored charge device having a charge state indicative of either a first logical state or a second logical state, and the voltage dropping device being a bi-directional device having a substantially definite first voltage drop while conducting in one direction and a substantially definite second voltage drop while conducting in another direction, the first and second voltage drops being unequal;

the method comprising:

initializing the word select lines to an idle voltage;

initializing a first subset of the column bit lines to a first precharge voltage, the relationship between the idle voltage and the first precharge voltage being such that voltages across the voltage dropping devices do not exceed the first and second voltage drops regardless of the charge state of the stored charge devices; initializing a second subset of the column bit lines to a second precharge voltage, the relationship between the idle voltage and the second precharge voltage being such that voltages across the voltage dropping devices do not exceed the first or second voltage drops regardless of the charge state of the stored charge devices;

driving the common word select line to a read voltage to access the memory cells coupled to the common word select line, the read voltage having a value that in combination with the first precharge voltage and the charge state:

causes voltages across the voltage dropping devices of the memory cells coupled to the common word select line not to exceed the first or second voltage drops when the charge state is indicative of the first logical state, whereby the column bit lines coupled to the accessed memory cells having the first logical state are not perturbed; and causes voltages across the voltage dropping devices of the memory cells coupled to the common word select line to exceed the second voltage drop when the charge state is indicative of the second logical state, whereby the column bit lines coupled to the accessed memory cells having the second logical state are perturbed and acquire a modified voltage, and the charge state of the accessed memory cells having the second logical state become indicative of the first logical state;

and the read voltage further having a value that in combination with the second precharge voltage and the charge state, voltages across the voltage dropping devices do not exceed the first and second voltage drops regardless of the charge state of the stored charge devices; and sensing the logical modes of the accessed memory cells based on whether the column bit lines are perturbed;

wherein the relationship between the idle voltage and the modified voltage is such that voltages across the voltage dropping devices do not exceed the first or second voltage drops regardless of the charge state of the stored charge devices.

16. A method as in claim 15, further comprising:

driving the column bit lines to a logical mode -dependent voltage based on the sensed logical modes of the accessed memory cells; and driving the common word select line to a write voltage to rewrite the accessed memory cells;

the relationship between the charge state, the write voltage and the logical mode -dependent voltage being such that:

when the charge state and the logical mode -dependent voltage are indicative of the first logical state, voltages across the voltage dropping devices do not exceed the first or second voltage drops; and when the charge state is indicative of the first logical state and the logical mode -dependent voltage is indicative of the second logical state, voltages across the voltage dropping devices exceed the first voltage drop;

the relationship between the idle voltage and the logical mode -dependent voltage being such that voltages across the voltage dropping devices do not exceed the first and second voltage drops regardless of the charge state of the stored charge devices.

17. A method to write a dynamic memory comprising:

a plurality of row select lines;

a plurality of column bit lines; and a plurality of memory cells;

wherein each memory cell is associated with one of the word select lines and one of the column bit lines so that at least two of the memory cells share a common word select line and at least two of the memory cells share a common column bit line; and wherein each memory cell comprising a stored charge device and a voltage dropping device, the stored charge device and the voltage dropping device being serially coupled between the associated word select line and the associated column bit line, the stored charge device having a charge state indicative of either a first logical state or a second logical state, and the voltage dropping device being a bi-directional device having a substantially definite first voltage drop while conducting in one direction and a substantially definite second voltage drop while conducting in another direction, the first and second voltage drops being unequal;

the method comprising:

driving the common word select line to a write voltage to write the accessed memory cells;

driving a first subset of the column bit lines to a logical mode -dependent voltage based on logical values of data to be written to the accessed memory cells; and driving a second subset of the column bit lines to a non-select voltage, the relationship between the write voltage and the non-select voltage being such that that voltages across the voltage dropping devices do not exceed the first and second voltage drops regardless of the charge state of the stored charge devices;

the relationship between the charge state, the write voltage, and the logical mode -dependent voltage being such that:

when the charge state and the logical mode -dependent voltage are indicative of the first logical state, voltages across the voltage dropping devices do not exceed the first or second voltage drops; and when the charge state is indicative of the first logical state and the logical mode -dependent voltage is indicative of the second logical state, voltages across the voltage dropping devices exceed the first voltage drop.

18. A memory cell comprising:

a first memory cell node;

a second memory cell node;

a third memory cell node;

a stored charge device coupled between the first and second cell nodes;

a first voltage dropping device having a definite voltage drop while conducting in one direction and no ability to conduct in the opposite direction, the first voltage dropping device being coupled between the third cell node and the second cell node so that it conducts in the direction from the third to the second cell node; and a second voltage dropping device having a definite voltage drop while conducting in one direction and no ability to conduct in the opposite direction, the second voltage dropping device being coupled between the second cell node and the third cell node so that it conducts in the direction from the second to the third cell node;

wherein the voltage drops of the first and second voltage dropping devices are unequal.

19. A memory cell as in claim 18 wherein the stored charge device is a capacitor.

20. A memory cell as in claim 18 wherein the first and second voltage dropping devices are diodes.

* * * * *